United States Patent [19]
Allfather

[11] Patent Number: 5,818,245
[45] Date of Patent: Oct. 6, 1998

[54] IMPEDANCE MEASURING

[75] Inventor: Lars P. Allfather, Boston, Mass.

[73] Assignee: Doble Engineering Company, Watertown, Mass.

[21] Appl. No.: 775,452

[22] Filed: Dec. 30, 1996

Related U.S. Application Data

[63] Continuation of Ser. No. 986,134, Dec. 4, 1992, abandoned.

[51] Int. Cl.$^6$ ................................................. G01R 27/26
[52] U.S. Cl. .......................... 324/707; 324/544; 324/539
[58] Field of Search .................................... 324/520, 522, 324/534, 543, 691, 707, 509, 544, 551; 361/42, 79

[56] References Cited

U.S. PATENT DOCUMENTS

| | | | |
|---|---|---|---|
| 3,934,176 | 1/1976 | Vasudevan et al. | 317/18 C |
| 3,937,214 | 2/1976 | Hutchins, IV | 128/2.1 A |
| 4,006,430 | 2/1977 | Meyer-Ebrecht | 331/65 |
| 4,113,998 | 9/1978 | Ashdown et al. | 324/539 X |
| 4,200,836 | 4/1980 | Okada et al. | 324/509 |
| 4,206,398 | 6/1980 | Janning | 324/527 X |
| 4,472,676 | 9/1984 | Eichmann et al. | 324/544 X |
| 4,510,490 | 4/1985 | Anderson, III et al. | 340/572 |
| 4,528,497 | 7/1985 | Arato | 324/51 |
| 4,562,393 | 12/1985 | Loyzim et al. | 318/599 |
| 4,638,242 | 1/1987 | Matsuno | 324/707 X |
| 4,779,985 | 10/1988 | Wirt | 356/350 |
| 4,857,830 | 8/1989 | Matsuno | 324/707 |
| 4,951,009 | 8/1990 | Collins | 333/17.3 |
| 5,010,405 | 4/1991 | Schreiber et al. | 358/141 |

FOREIGN PATENT DOCUMENTS 0 061 704 A1  3/1982  European Pat. Off.

*Primary Examiner*—Maura K. Regan
*Attorney, Agent, or Firm*—Fish & Richardson, P.C.

[57] ABSTRACT

Impedance of a power system adapted for operation at a predetermined line frequency is measured by providing a test signal of frequency different from the predetermined line frequency by an increment significantly less than the predetermined line frequency to provide an impedance measurement signal representative of the impedance of the power system at the test frequency. The impedance measurement signal is processed to provide a line impedance signal representative of the power system impedance at the predetermined line frequency.

14 Claims, 12 Drawing Sheets

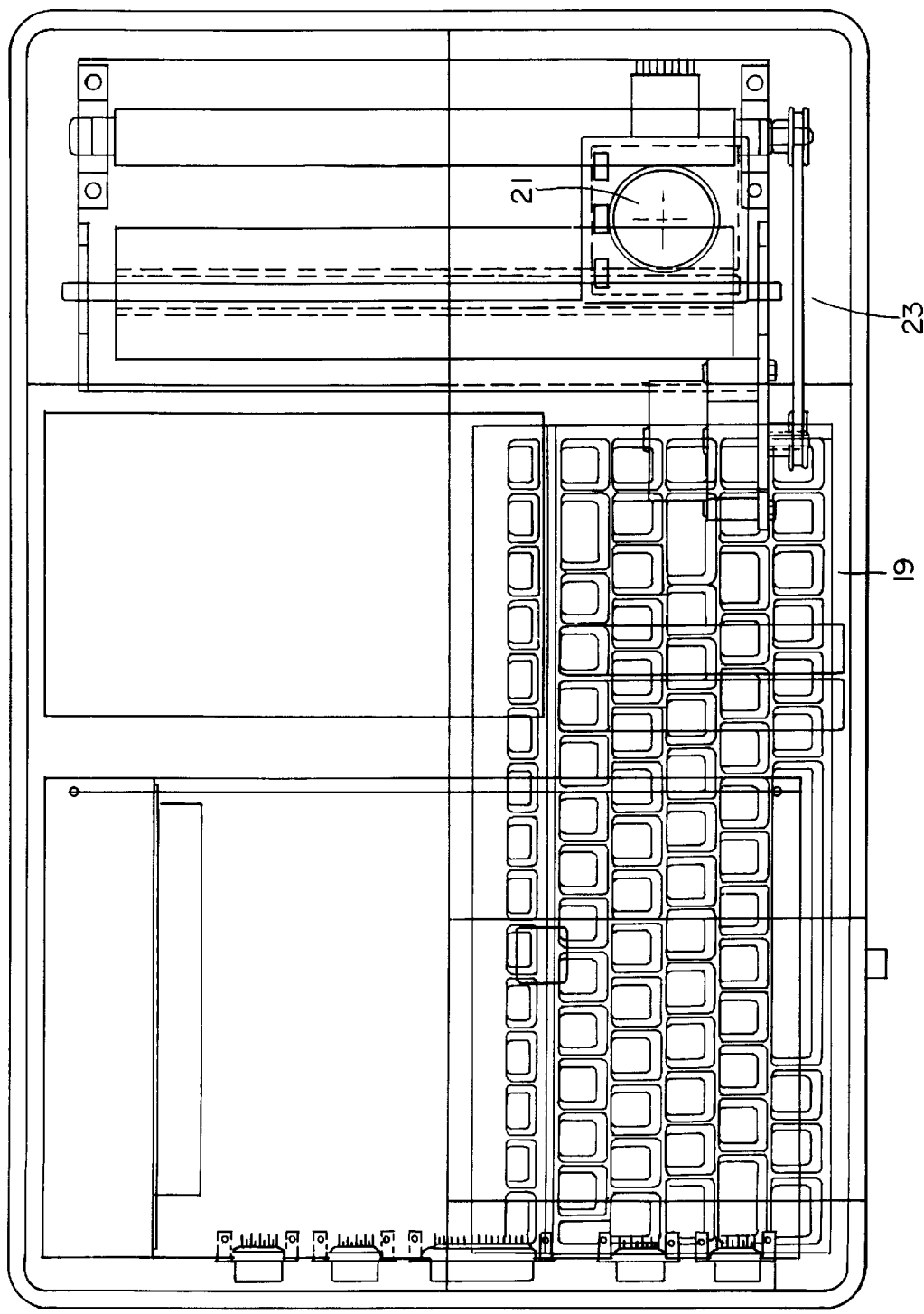

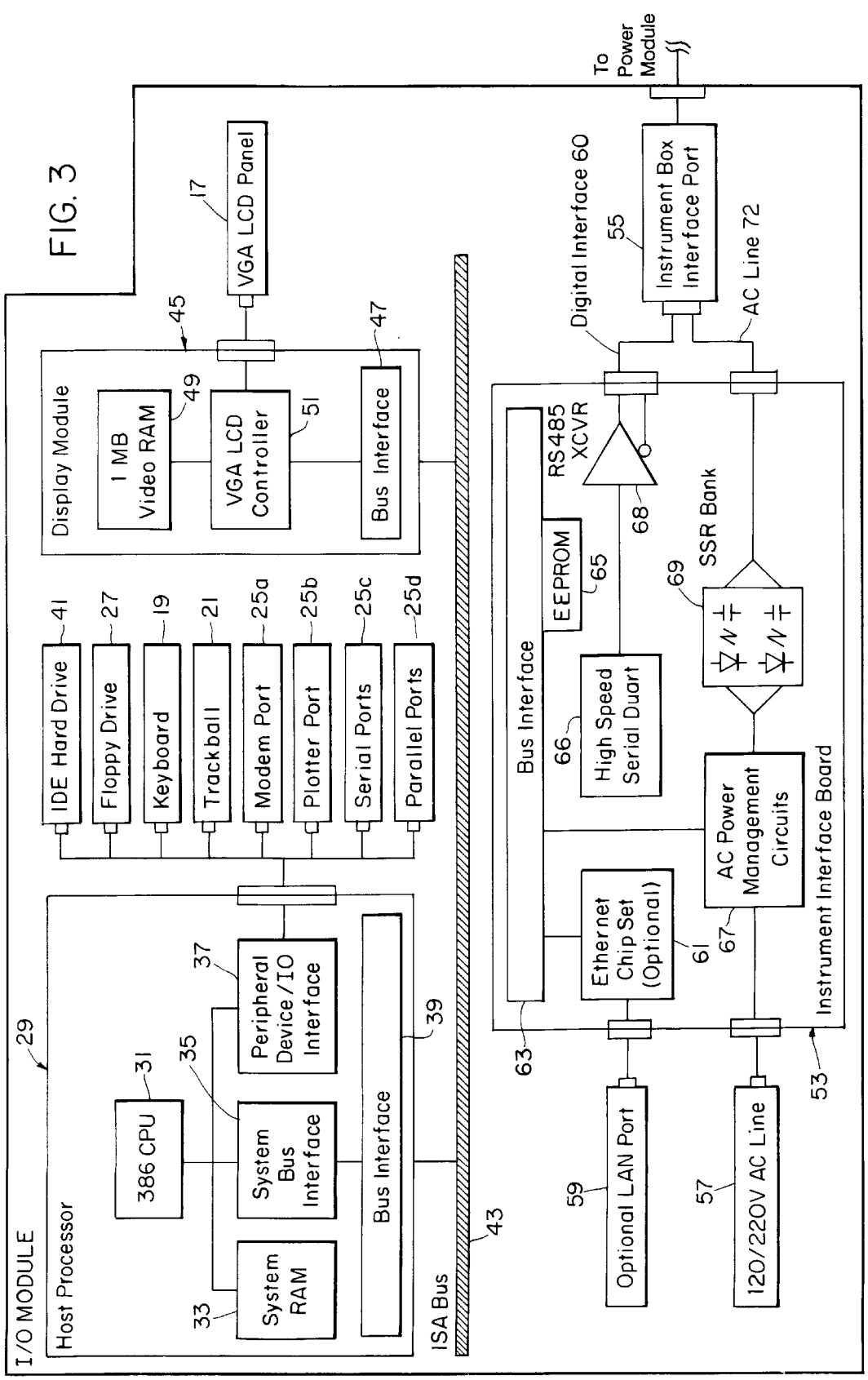

IMPEDANCE MEASURING

This is a continuation of application Ser. No. 07/986,134, filed Dec. 4, 1992, now abandoned.

The present invention relates in general to impedance measuring and more particularly concerns novel apparatus and techniques for impedance measuring using dither. The invention is useful, inter alia, for evaluation of the condition of electrical insulation in a high-voltage power system.

Evaluation of electrical insulation in a power system apparatus has a number of uses, including scheduling of preventive maintenance, qualifying a power system apparatus going into service, and trouble-shooting an apparatus to determine the cause of an unknown failure or problem.

A prior art impedance measuring apparatus known as the "M2H" (manufactured by Doble Engineering Co., Watertown, Mass.) has been used in the industry for some time. This apparatus tests a power system by applying an AC voltage stimulus of up to 12 kV which has a fundamental frequency component at the power system frequency. The condition of the electrical insulation of the power system is determined using the power factor or watts loss measured at the power system or "line" frequency.

A test is usually performed on only one portion of the power system at a time, and this portion is disconnected from the rest of the power system prior to the test. The portion tested or "test specimen" may be either grounded or ungrounded, and often will be located outdoors in a remote energized substation. Most test specimens can be modeled as a parallel R-C impedance where, at the line frequency, the capacitive impedance is much lower than the resistive impedance. Exceptions to this model exist, however, including transformer magnetizing impedance specimens which appear inductive, and some varistors which appear mostly resistive.

The M2H impedance measuring apparatus is typically attached to the test specimen with special test cables. A high-voltage cable applies the AC voltage stimulus. Low-voltage cables provide current return paths which may be used for guarding, grounding, or measurement. If the specimen is a large capacitor, such as a generator stator winding, an inductor may be provided to reduce the output requirements at the test system. An internal reference impedance branch in the test system is also stimulated by the AC test voltage, and the current that flows in this reference branch is used to drive a first analog AC voltmeter.

At least two persons typically perform the actual test: an operator and a safety supervisor. Both persons must activate momentary safety switches to activate the test output voltage. During the test, a second analog or digital voltmeter provides three sequential functions. First, the voltmeter in the "check" mode manually normalizes its full-scale reading against the reference branch current. This check forces certain test quantities to be normalized to a constant test voltage, regardless of the actual test voltage. Then, the voltmeter in "current" mode measures normalized specimen current, and in "watts" mode measures normalized specimen watts loss.

The watts loss measurement in the M2H system is performed by having the user manually balance out the reactive component of the specimen current at the fundamental test frequency with the balancing reactive component generated by the internal reference branch current. The power factor may then be calculated by the user based on the specimen test voltage, normalized watts loss, normalized current, and capacitance.

The % power factor of the specimen is calculated as follows:

$$\text{Power Factor} = \frac{\text{Watts}}{\text{Test Voltage} \times \text{Total Current}} = \frac{\text{Watts}}{E \times I_T} \quad (3)$$

therefore:

$$\% \text{ Power Factor} = \frac{\text{Watts}}{E \times I_T} \times 100 \quad (4)$$

Since the Type M2H Test Set reads in terms of Equivalent 10-kV Values and, for $I_T$ in terms of milliamperes, Equation (4) becomes:

$$\% \text{ Power Factor} = \frac{\text{Watts} \times 100}{10{,}000 \times \frac{\text{Milliamperes}}{1000}} = \frac{\text{Watts} \times 10}{\text{Milliamperes}} \quad (5)$$

$$= \frac{\text{Watts} \times 10}{\frac{\text{Microamperes}}{1000}} = \frac{\text{Watts} \times 10{,}000}{\text{Microamperes}} \quad (6)$$

While some specially modified equipment can measure inductance, this measurement is normally omitted because of its sensitivity to line frequency variations.

A significant source of errors in measurements taken with the known test system are currents capacitively coupled into the test specimen and leads from energized conductors in the power system. These capacitively coupled currents cause interference which introduces measurement errors by influencing the measured specimen current. According to the known system, one way of reducing this error is by performing a second measurement with the test voltage shifted 180° with respect to the input power line, and then averaging the results.

For more severe cases of interference, it is also known to use an interference cancellation circuit (ICC) to manually cancel the interference current. In this case, the interference current is separately measured prior to the test with the test voltage removed. However, both techniques fail to completely remove the errors caused by interference. Particularly, variations in the test voltage source impedance and power line impedance prevent accurate cancellation of the error. Moreover, the prior art methods may actually create additional errors due to variations in interference magnitude and phase between reversals and variations occurring after adjustment of the ICC. Under severe conditions where the interference current magnitude is several times the test current magnitude, or where the interference has little coherence with the test voltage signal, obtaining a meaningful watts reading may be impossible due to meter fluctuations.

Broadly speaking, the invention embraces measuring impedance of a power system adapted for operation at a predetermined line frequency including providing a test signal of frequency different from the predetermined line frequency, setting the frequency of the test signal to at least one desired test frequency different from the predetermined line frequency by an increment significantly less than the predetermined line frequency. The test signal is coupled to the power system to provide an impedance signal representative of the impedance of the power system at the frequency of the test signal, and processing the impedance signal representative of the impedance of the power system at the frequency of the test signal to provide a line impedance signal representative of the power system impedance at the predetermined line frequency. Typically, there are at least first and second test signals at first and second test frequencies, respectively, below and above the predetermined line frequency to provide first and second impedance signals, respectively, and these impedance signals are processed, typically by averaging, to provide the line impedance signal representative of the power system impedance at the predetermined line frequency.

According to the invention, interference at the line frequency is avoided using line frequency modulation, whereby measurements taken at frequencies on either side of the line frequency are interpolated to yield a value equivalent to the impedance at the line frequency. Thus, the values obtained using line frequency modulation can be compared to historical data of the tested specimen where the data was taken using the prior art method of measuring impedance at the line frequency directly. To perform a test, the test specimen is disconnected from the power system as described above with respect to the M2H device. Despite the disconnection of the test specimen, however, currents may be capacitively coupled into the test specimen and leads at the line frequency due to nearby energized power lines. According to the invention, the test specimen and the reference branch of the apparatus, which will be described in more detail below, are stimulated with an AC test voltage waveform whose fundamental component is slightly greater than the fundamental line (interference) frequency. The measurement circuits contain filters which reject all but the test voltage frequency. Specimen current and watts loss are then measured at the test frequency. Subsequently, the test specimen and reference branch are stimulated with a second AC test waveform having the same voltage as the first test waveform but whose fundamental component frequency is slightly less than the fundamental line frequency. A second set of measurements is obtained, and interpolation is employed to obtain a result indicative of impedance at the line frequency. Although various schemes are available for interpolating the final results, the straight-line method (simple averaging) is preferred.

For a 60 Hz line frequency, the apparatus of the invention allows test voltage frequencies in the range of 45–66 Hz with 0.1% setting resolution and accuracy. Preferably, test voltage frequencies are used which are geometrically or arithmetically spaced plus or minus 5% away from the line frequency and are geometrically or arithmetically averaged to derive the line frequency impedance. It has been discovered that the plus or minus 5% spacing yields results well within target specifications for specimens modeled as any network of resistors and capacitors.

Other features, objects and advantages will become apparent from the following detailed description when read in connection with the accompanying drawings in which:

FIGS. 2a and 2b are top and side views, respectively, of the lower portion of the I/O module of the exemplary embodiment;

FIG. 3 is a block diagram of the I/O module of the exemplary embodiment;

Figure 1:
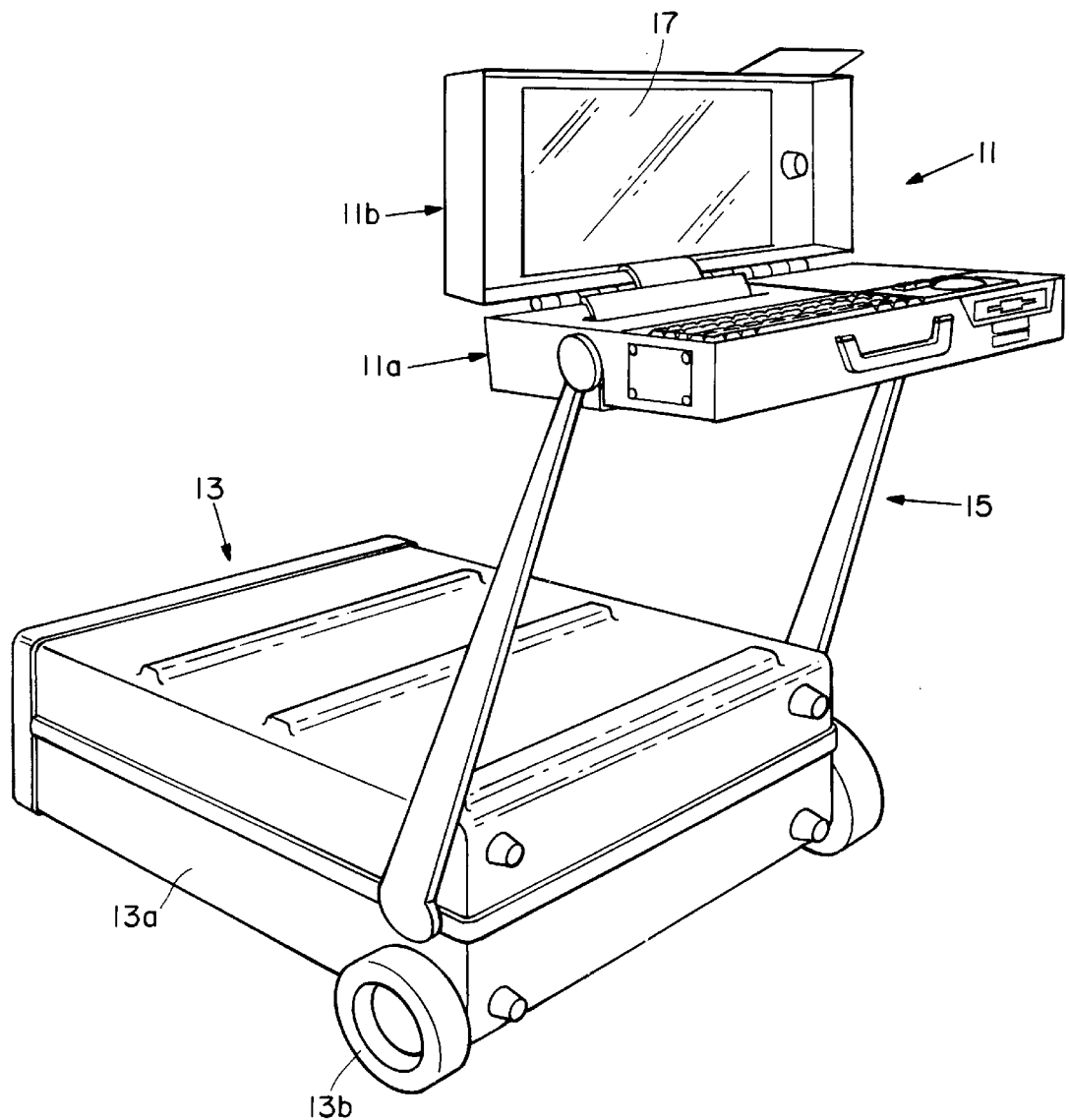
FIG. 1 is a perspective view of an exemplary embodiment of the invention.

Referring to FIG. 1, there is shown an exemplary embodiment of the apparatus of the invention comprising an I/O module 11 and a power module 13. Power module 13 has a case 13a, which is substantially impervious to moisture and other external contamination, with wheels 13b to facilitate movement thereof. Case 13a may be an aluminum space frame chassis covered with an ABS protective cover, or may use a steel chassis for improved shielding. I/O module 11 is mounted on power module 13 via folding arms 15 which allow the apparatus to be stored compactly, while providing convenient access to the I/O module for the user when in the folded-out position shown. I/O module 11 is formed of molded fiberglass laminate and is divided into a lower portion 11a and an upper portion 11b. Upper portion 11b houses a VGA LCD panel 17, and folds down over the lower part 11a for protection during transport.

Figure 2B:
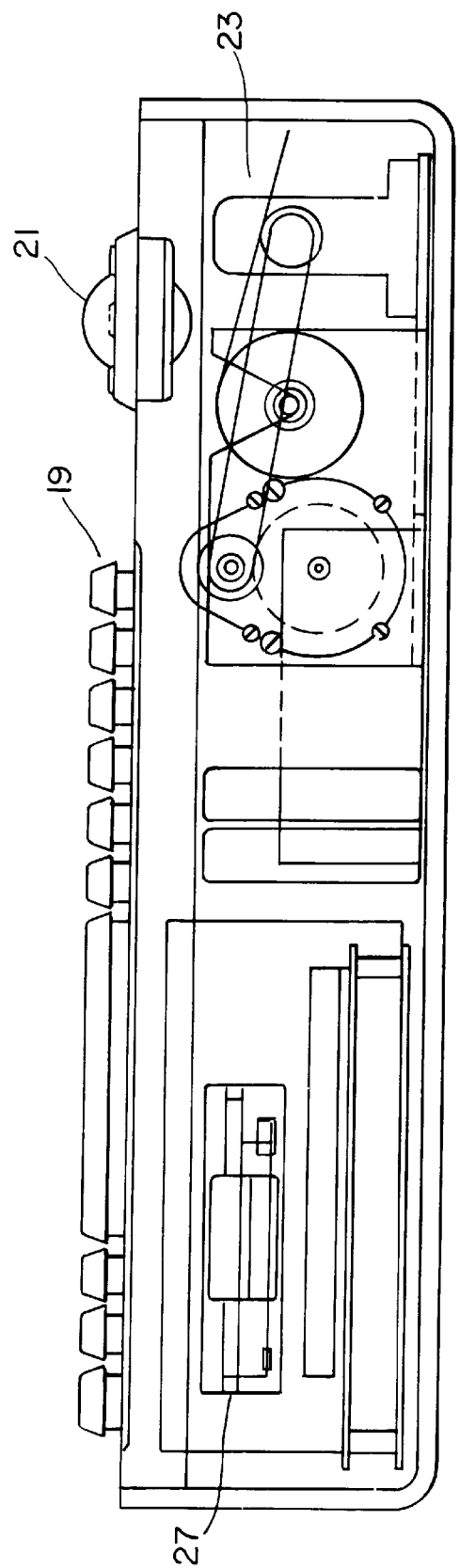
Figure 4A:
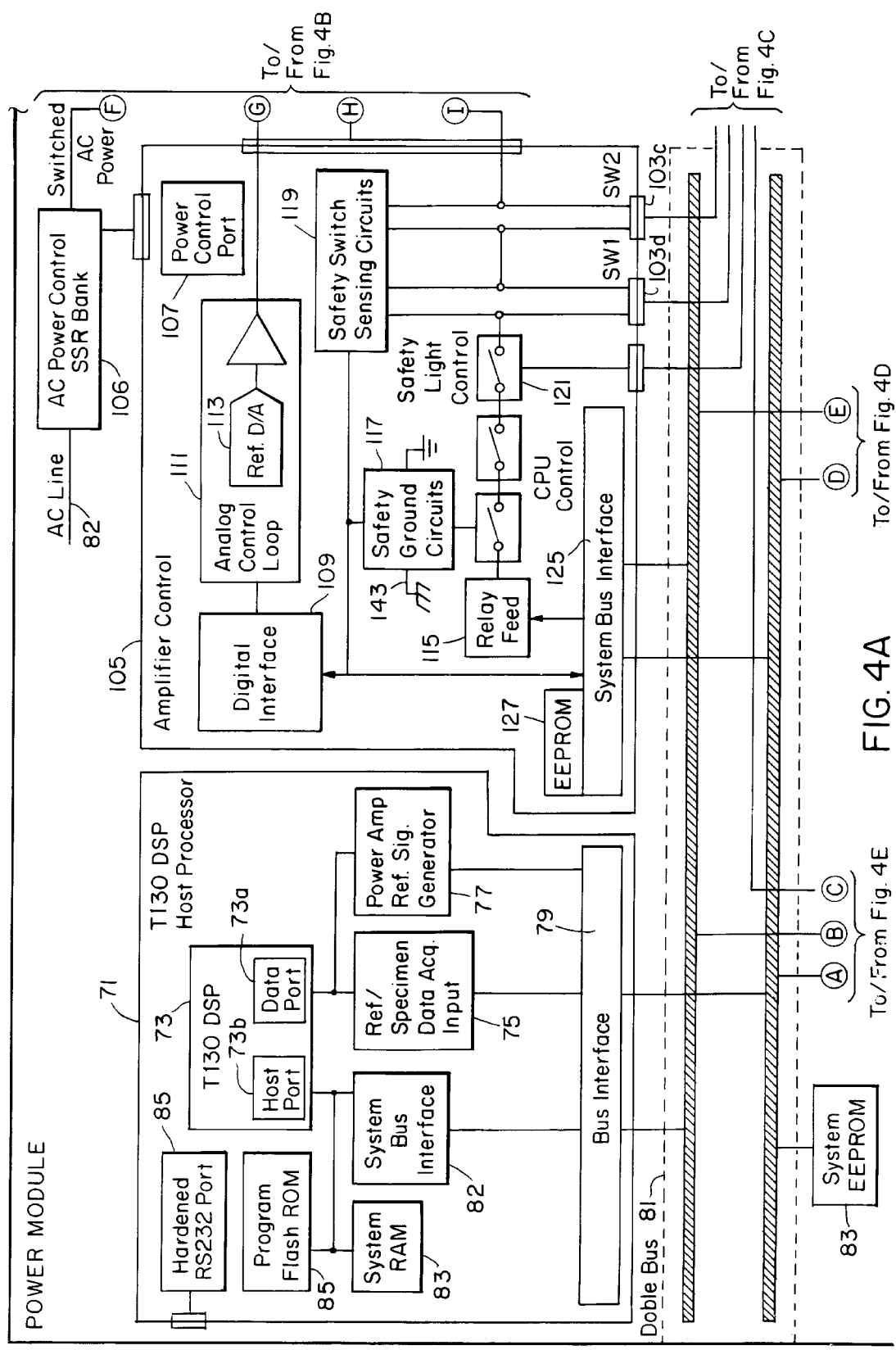
FIG. 4A–4E is a schematic diagram of the measurement module of the invention according to an exemplary embodiment.
Figure 4B:
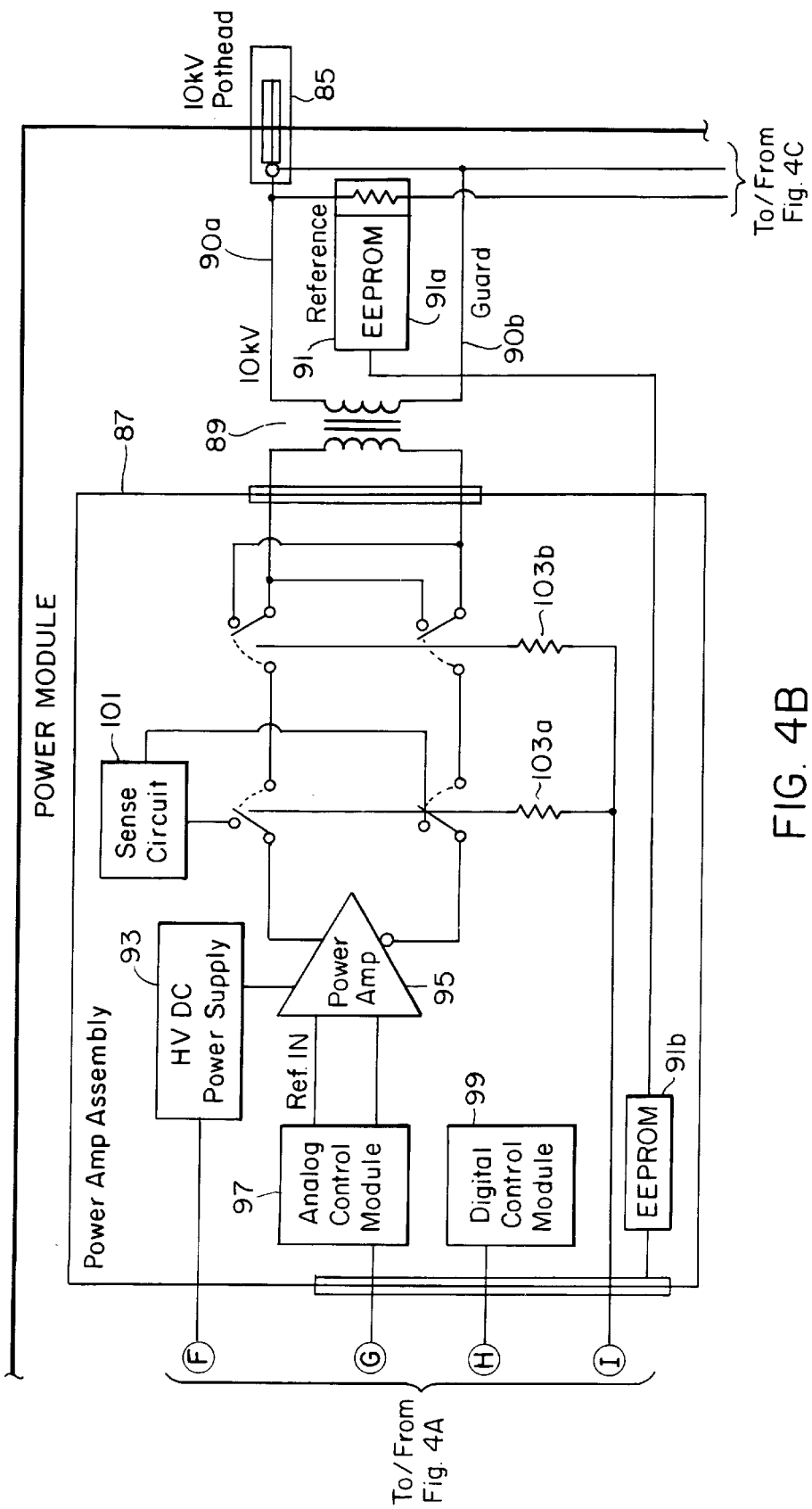
Figure 4C:
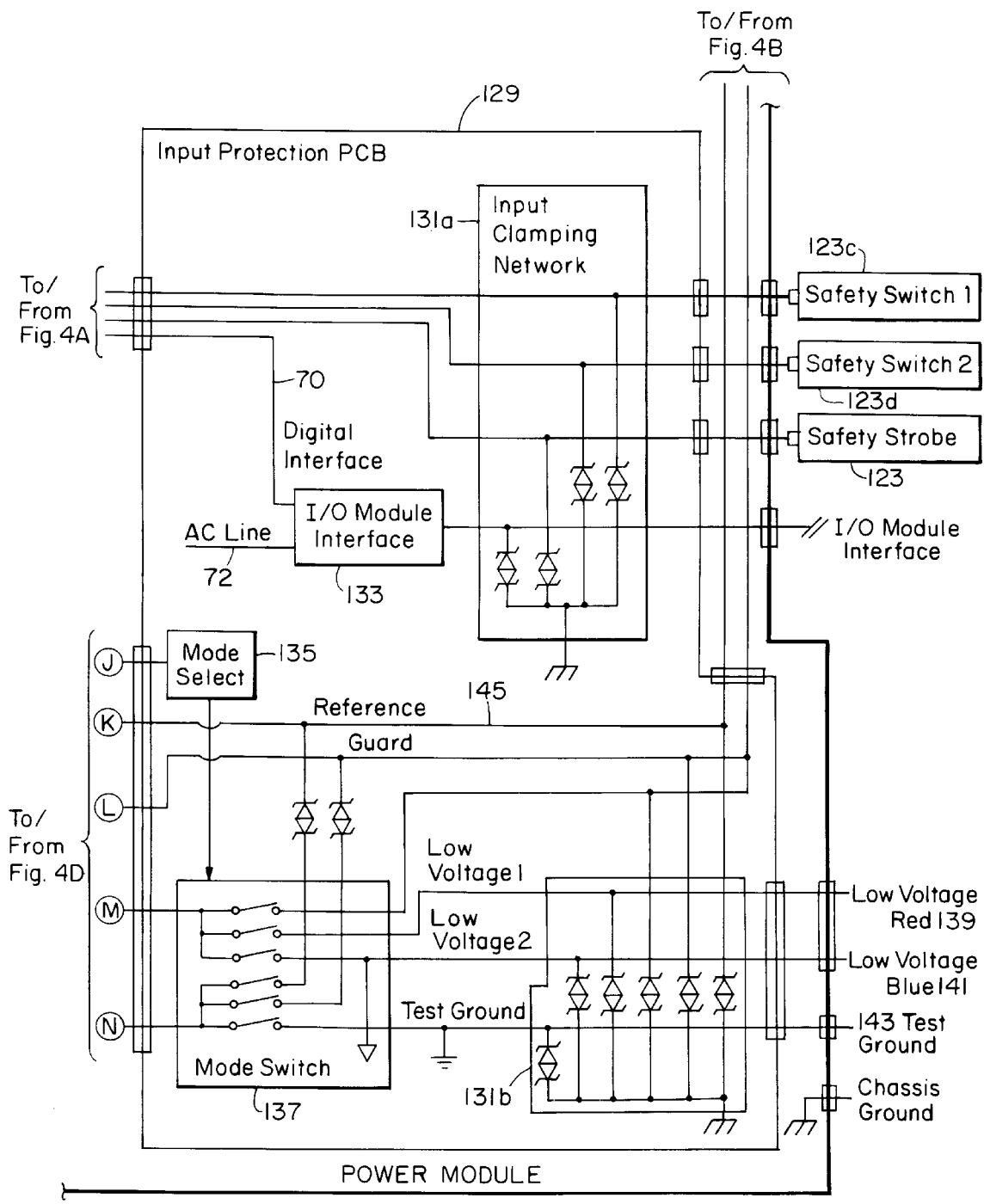
Figure 4D:
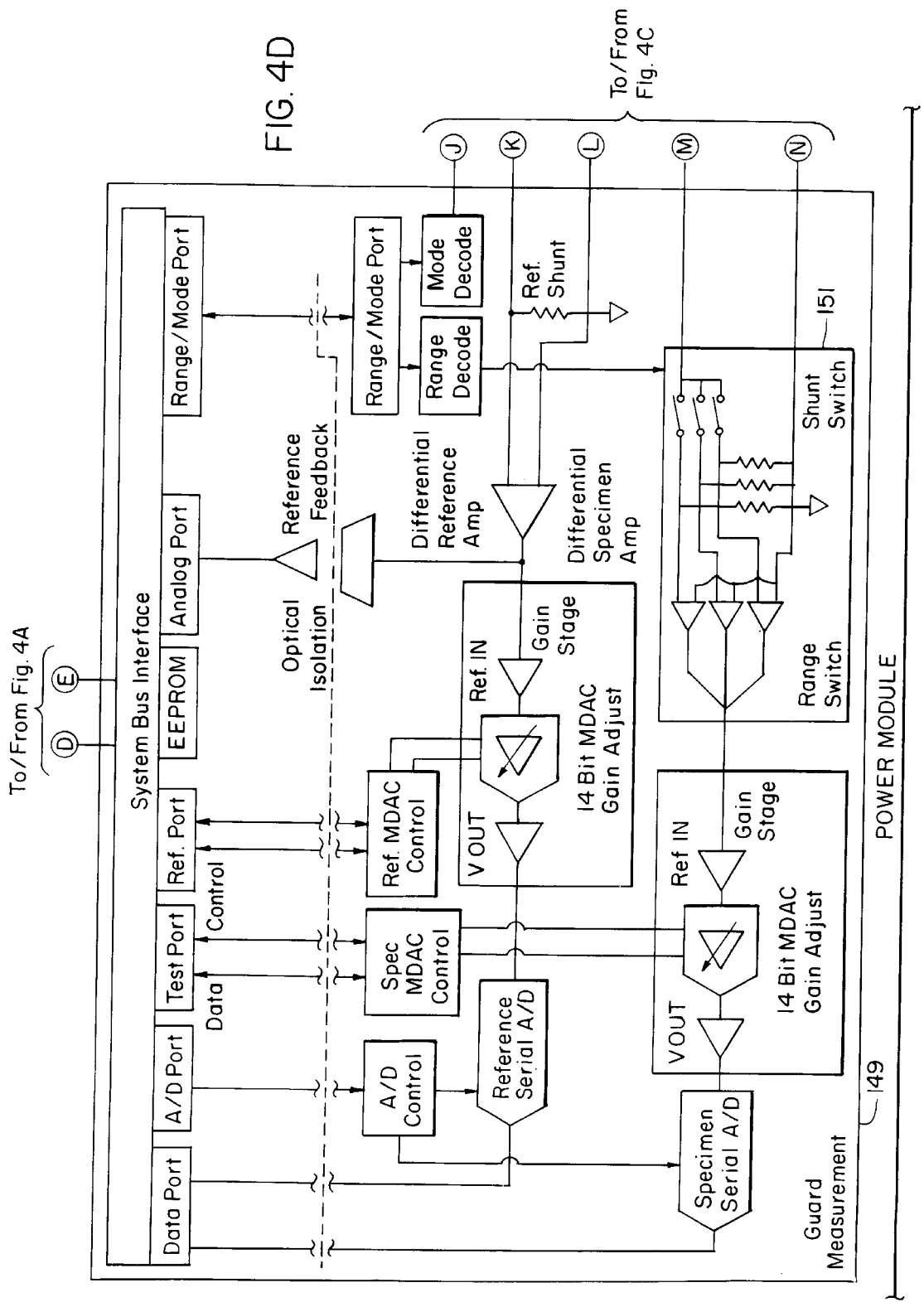
Figure 4E:
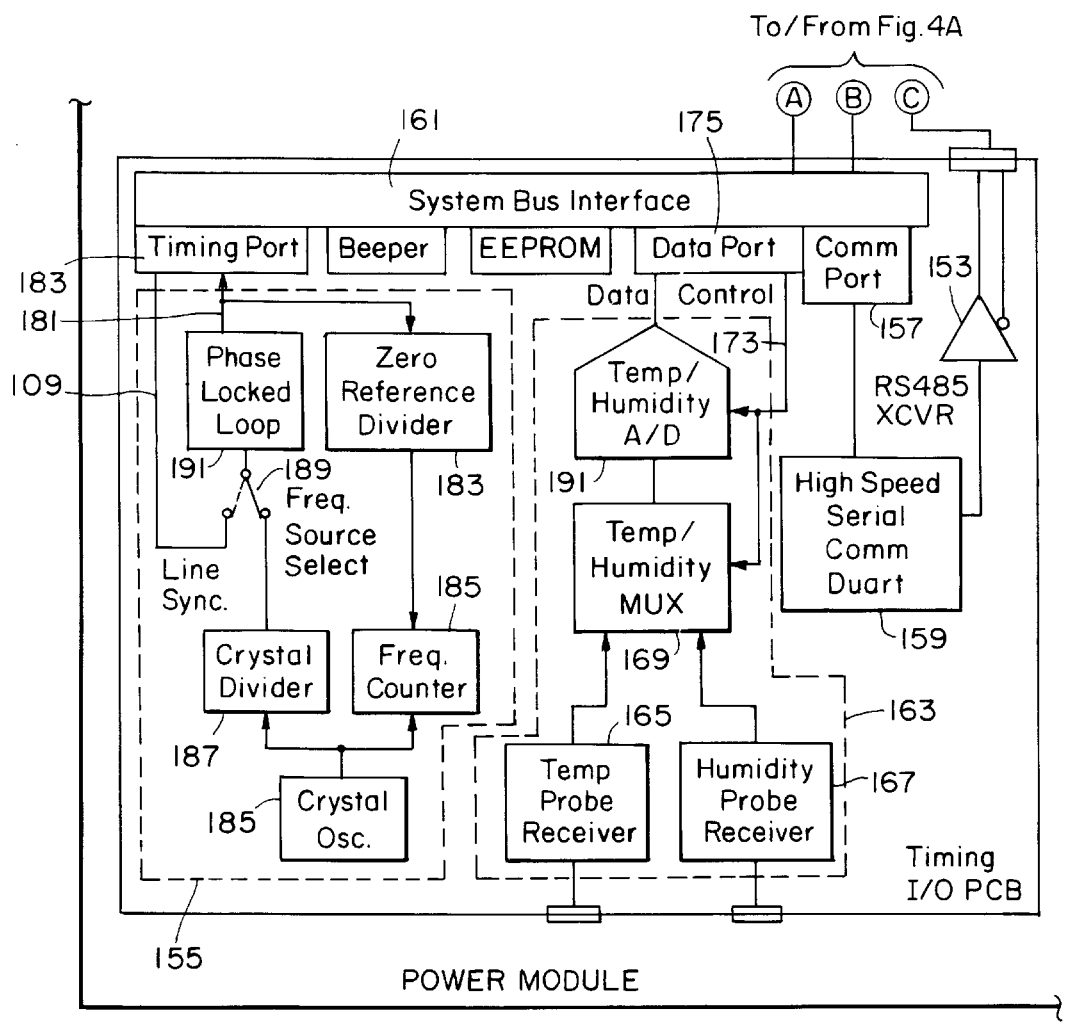

Referring to FIGS. 2a and 2b, there are shown top and front views, respectively, of lower portion 11a of I/O module 11. Lower portion 11a includes a standard notebook type keyboard 19, a track ball 21, a printer 23, I/O ports 25 (FIG. 3), and a floppy disk drive 27. Printer 23 is typically an 8" thermal dot matrix printer, such as that available from Doble Engineering Co. of Watertown, Mass. Lower portion 11a of I/O module 11 also includes a host processor which is typically a 386 DOS microcomputer, an instrument interface board, and other internal components which are not shown in FIGS. 2a–2b and which will be described in more detail below.

A block diagram of I/O module 11 is shown in FIG. 3. I/O module 11 includes a host processor 29 which controls the overall operation of the apparatus. Host processor 29 includes a 386 central processing unit (CPU) 31, system RAM 33, system bus interface 35, peripheral device and I/O interface 37, and bus interface 39. Peripheral device and I/O interface 37 interfaces with an internal IDE hard drive 41 and the floppy drive 27, keyboard 19, track ball 21 and ports 25. Ports 25 include a modem port 25a, plotter port 25b, serial ports 25c and parallel ports 25d. ISA bus 43 is provided for internal communication via bus interface 39.

I/O module 11 has a display module 45 including bus interface 47 for communication with ISA bus 43, a one MB video RAN 49, and VGA LCD controller 51. Controller 51 controls the VGA LCD panel 17 which, as noted above, is mounted in upper portion 11b of I/O module 11.

I/O module 11 further includes instrument interface board 53 which communicates with power module 13 via an instrument box interface port 55 and which accepts input power on a 120/220 volt AC line 57. Optionally, instrument interface board 53 may also communicate with a local area network (LAN) via optional LAN port 59 and Ethernet chip set 61. The interface board 53 includes bus interface 63 for communication with ISA bus 43 and an associated EEPROM 65. AC power management circuits 67 accept the power from AC line 57 under control of host processor 29 and apply power on AC line 72 via SSR bank 69 to instrument box interface port 55. Data from and to host processor 29 is applied to digital interface line 60 via high speed DUART 66 and RS485 transceiver 68.

A schematic diagram of power module 13 is shown in FIG. 4. Power module 13 includes a DSP host processor 71 centered around a TI30 DSP processor 73. DSP processor 73 includes a data port 73a and host port 73b. Data port 73a communicates with reference/specimen data acquisition input 75 and power amp reference signal generator 77 which, in turn, receive and transmit data via bus interface 79. Host port 73b receives data from host processor 29 via system bus interface 82. RAM 83 and program flash ROM 85 are provided for local memory. Hardened RS232 port 85 is included in DSP host processor 71 for serial communication.

Bus interface 79 communicates with I/O module 11 and other elements within measurement module 13 over Doble bus 81, which is a specialized bus used in commercially available systems manufactured by Doble Engineering Company of Watertown, Mass., and incorporated by reference herein.

The M4000 backplane is a four-layer board consisting of seven cardcage slots, and a power supply connector. The physical layout and component orientation is shown in FIG. 1. The cardcage comprises seven identical expansion slots, any one of which can contain the host CPU. Each slot consists of two 64-pin double-row DIN connectors (P1, P2) to maintain compatibility with the existing Doble bus structure, and a 32-pin double-row half-DIN connector that adds the functionality of 32-bit data, multimastering, and serial EEPROM I/O to each slot. All cardcage slots are spaced 0.80" apart with the following exception: the spacing between expansion slot 6 and expansion slot 7 is 0.25" greater to accommodate a shield assembly to be installed over the instrument cards in expansion slots 6 and 7 for the M4000 application.

The backplane signals are structured in the following groups: MULTIBUS I bussed signals conforming to IEEE 796 specification, extended data path (32 bit) and bus mastering signals, serial EEPROM I/O access bus, and a set of general purpose digital and analog bussed signals. Connector P1 contains the Multibus 1 signals, connector P2 contains the general purpose analog and digital signals, and connector P3 contains the extended multibus lines and the serial EEPROM I/O bus.

Each cardcage board has an on-board EEPROM that contains information such as the board type, revision level, serial number, calibration settings, etc. that is read by the host processor during system initialization. In addition, each cardcage board can support up to 15 serial EEPROMs located off-board. The system software supports both 1Kx1 and 4Kx1 devices (industry standard 9346 and 9366 serial EEPROMs). In the M4000 application, 4Kx1 9366 devices are used. Doble bus 81 has system EEPROM 83 for system programming.

A high-voltage signal (typically 10 kV) to be applied to the test specimen is output via terminal 85. AC power is supplied over AC line 72 from I/O module 11 and is extracted by I/O module interface 133, discussed in more detail below. AC line 72 is coupled to AC power control and SSR bank 106, which is controlled by amplifier control 105, also discussed below. The output of SSR bank 106 provides power to power amp assembly 87, which outputs a desired test frequency waveform to the primary winding of step-up transformer 89. The secondary winding of transformer 89 provides the high-voltage output to terminal 85, which senses the potential difference between the voltage on line 90a and the voltage on guard line 90b. Guard line 90b may or may not be grounded to the test ground, depending upon the state of mode switch 137 described below. Digital and analog feedback is provided from high-voltage line 90a by reference circuit 91. Analog feedback is provided on reference line 145, while digital feedback is provided to amplifier control 105 via EEPROMs 91a, 91b.

Power to power amp assembly 87 is input from the SSR bank 106 to high voltage DC power supply 93, which in turn powers power amplifier 95. The output of power amplifier 95 is determined by an analog reference signal generated by amplifier control 105 (described in more detail below) and analog control module 97. Analog control module 97 accepts the reference signal input and a local feedback control signal from power amplifier 95 and applies a desired reference input to power amplifier 95.

The output of power amplifier 95 is applied to the primary winding of transformer 89 via a pair of safety relays 103a, 103b which prevent accidental actuation of the high-voltage output. Safety relays 103a, 103b are manually closed by safety switches 103a, 103d, respectively, which are mounted externally. The open state of first safety relay 103a is sensed by sense circuit 101 which relays this information to safety switch sensing circuit 119. The second safety relay 103b when in the open position short-circuits the primary winding of transformer 89 to prevent shock due to induced voltages in the transformer.

Amplifier control 105 has three basic functions: control of input power to power amplifier 95, generation of an analog reference signal for control of power amplifier 95, and safety control. Control of the input power is achieved via power control port 107.

Solid state relay (SSR) 106 switches the input AC line voltage to power amp assembly 87 as directed by power control port 107. For a nominal input AC line voltage of 120 V, SSR 106 is configured as a voltage doubler. For a nominal input AC line voltage of 240 V, SSR 106 is configured as a full wave rectifier. Thus, for either 120 V or 240 V AC line voltage SSR 106 passes effectively the same voltage level to HV DC power supply 93.

Digital interface 109 receives a digital control signal from power amp reference signal generator 77 and applies the signal to analog control loop 111, which generates an analog reference signal using reference D/A converter 113. Safety control is achieved by relay feed 115, safety ground circuits 117, and safety switch sensing circuits 119, which cooperatively ensure that safety relays 103a, 103b are not closed unless instructed by host processor 29 with both safety switches 103a, 103d closed.

Safety switch sensing circuit 119 monitors the contact status of safety switches 103c and 103d and passes this information to host processor 71.

Safety ground circuit 117 monitors the DC resistance between external test ground lead 143 and chassis ground and passes this information to host processor 71.

Safety light control 121 indicates activation of the high voltage output via safety strobe 123, which provides a visual indication of actuation of the high-voltage output. Communication with Doble bus 81 is achieved via system bus interface 125 having local EEPROM 127.

Input protection PCB 129 furnishes isolation and surge protection of measurement module 13. PCB 129 includes input clamping networks 131a, 131b, which comprise back-to-back zener diodes to protect against spurious currents. Input protection PCB 129 also includes I/O module interface 133 which interfaces with the I/O module output to extract digital interface line 70 and AC line 72.

Input protection PCB 129 also includes mode select 135, which controls a series of relays contained in mode switch 137. Mode switch 137 selectively connects one or more of the test ground 143, reference line 145 (taken from reference device 91), and guard line 90b to range switch 151 provided in guard measurement device 149. Mode switch 137 also connects one or more of guard line, low voltage red line 139, and low voltage blue line 141 to range switch 151. Guard measurement device 149 is described in more detail below.

Digital interface 70 output by I/O module interface 133 is connected to an RS485 transceiver 153 on timing I/O PCB 155. This signal is then output to Doble bus 81 via high speed serial communication DUART 159 and communication port 157 of system bus interface 161.

Timing I/O PCB 155 also includes a humidity/temperature determination circuit 163 that measures the ambient temperature and relative humidity. Temperature and relative humidity are factors that effect the electrical characteristics of insulation and are used in the overall evaluation process of specimens under test.

Circuit 163 includes temperature probe receiver 165, humidity probe receiver 167, temperature/humidity multiplexer 169, and temperature/humidity A/D convertor 171. The output of temperature/humidity determination circuit 163 and feedback control 173 are input/output via data port 175 of bus interface 161.

Timing I/O PCB 155 further includes timing circuit 177 which accepts linesync signal 179 and outputs a phase-locked timing signal on line 181 via timing port 183. Crystal oscillator 185 and crystal divider 187 generate an internal timing signal. Frequency source select 189 allows selection between linesync signal 179 and the internally generated timing signal, depending upon the desired mode of operation. Phase-locked loop 191 stabilizes the selected frequency, and zero reference divider 193 and frequency counter 195 monitor the timing signal output on line 181.

Guard measurement 149 contains low voltage circuits whose signal common is connected to the low end 80b of 10 kV transformer 89. Guard measurement assembly 149 contains resistive shunts and differential voltage amplifiers that convert the currents from the reference impedance 91 and the low voltage specimen leads 139 and 141 to voltage levels suitable for measurement. Multiplying digital to analog converters (MDACs) controlled by the host processor 71 scale these signals prior to analog-to-digital conversion.

The operation of the apparatus of the invention will now be described in detail.

A test begins in substantially the same way as described above using the Doble M2H impedance measuring apparatus. The types of test specimens and the test lead hook-up are the same as described above.

The test specimen is stimulated with a high-voltage AC waveform through a high-voltage lead connected to 10 KV pothead 85. The specimen return current from the specimen is brought through one or both low voltage lead connections 139 and 141. Mode switch 137 selects the low voltage lead current to be measured. Range switch 151 selects a resistive shunt that converts the specimen current to a proportional voltage that is further scaled and digitized on guard measurement 149.

Reference impedance branch 91 is also stimulated with the same high-voltage AC waveform. Return current from the reference branch is scaled and digitized by circuitry on guard measurement 149.

The host processor 71 controls all aspects of the high-voltage waveform generation and signal measurement process. Host processor 71 directs Timing I/O PCB 155 to produce clock signals that cause power amp reference signal generator 77 to produce a sine wave test signal at a desired test frequency slightly above or below the power line frequency. Amplifier control 105 and power amp assembly 87 work together to boost the power level of this test signal and apply it to the test-specimen through high-voltage step-up transformer 89.

The digitized reference impedance 91 current and specimen current are processed by digital filtering algorithms on host processor 71 to reject power line frequency interference. Host processor 71 determines the specimen electrical impedance characteristics relative to the reference impedance branch at the test frequency using conventional phasor (vector) math.

A second test is performed at a frequency slightly above or below the power line frequency (whichever was not done during the first test) and a second set of results are obtained. The two sets of results are combined using interpolation to yield a final result. The final result more closely represents the specimen impedance at the power line frequency than either of the individual test results taken above and below the power line frequency.

Figure 5:
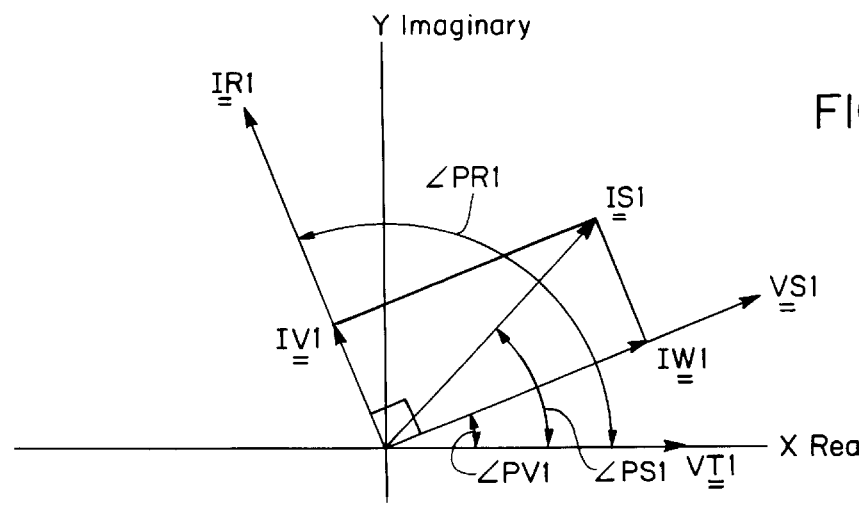
FIG. 5 is a phasor diagram helpful in understanding exemplary calculations.
Figure 6A:
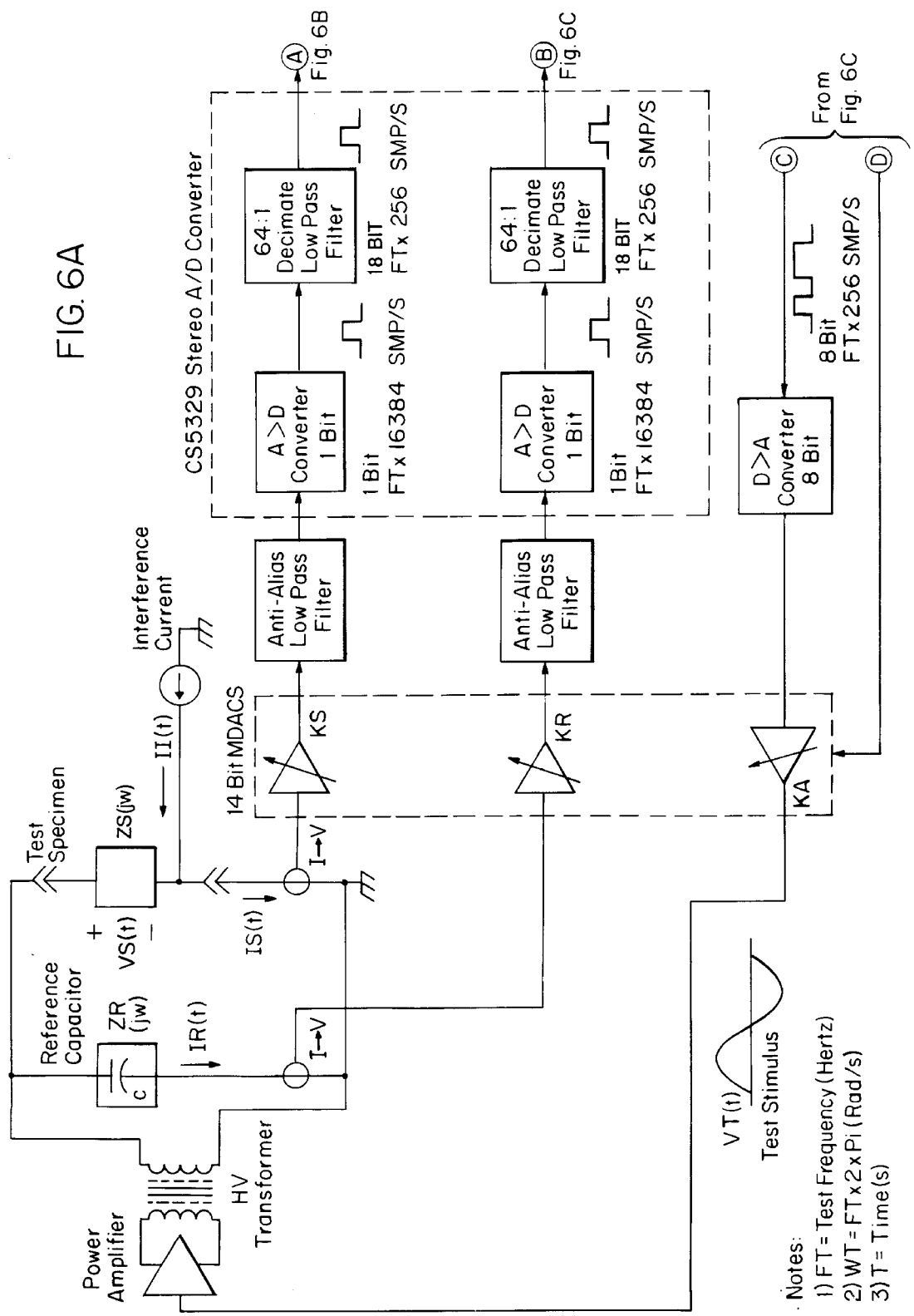
FIG. 6A–6C is a signal flow and processing diagram helpful in understanding signal flow and processing in an exemplary embodiment.
Figure 6B:
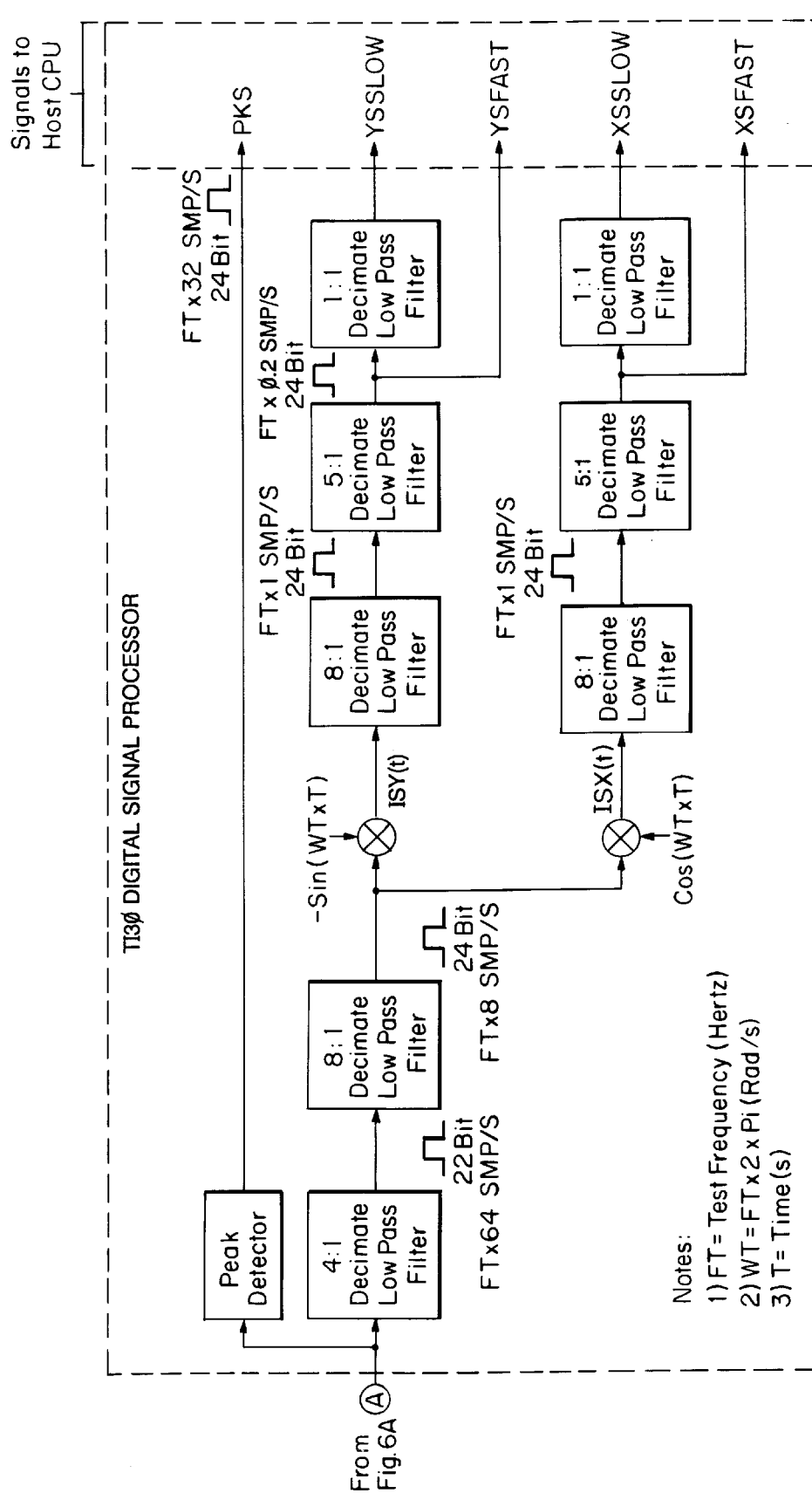
Figure 6C:
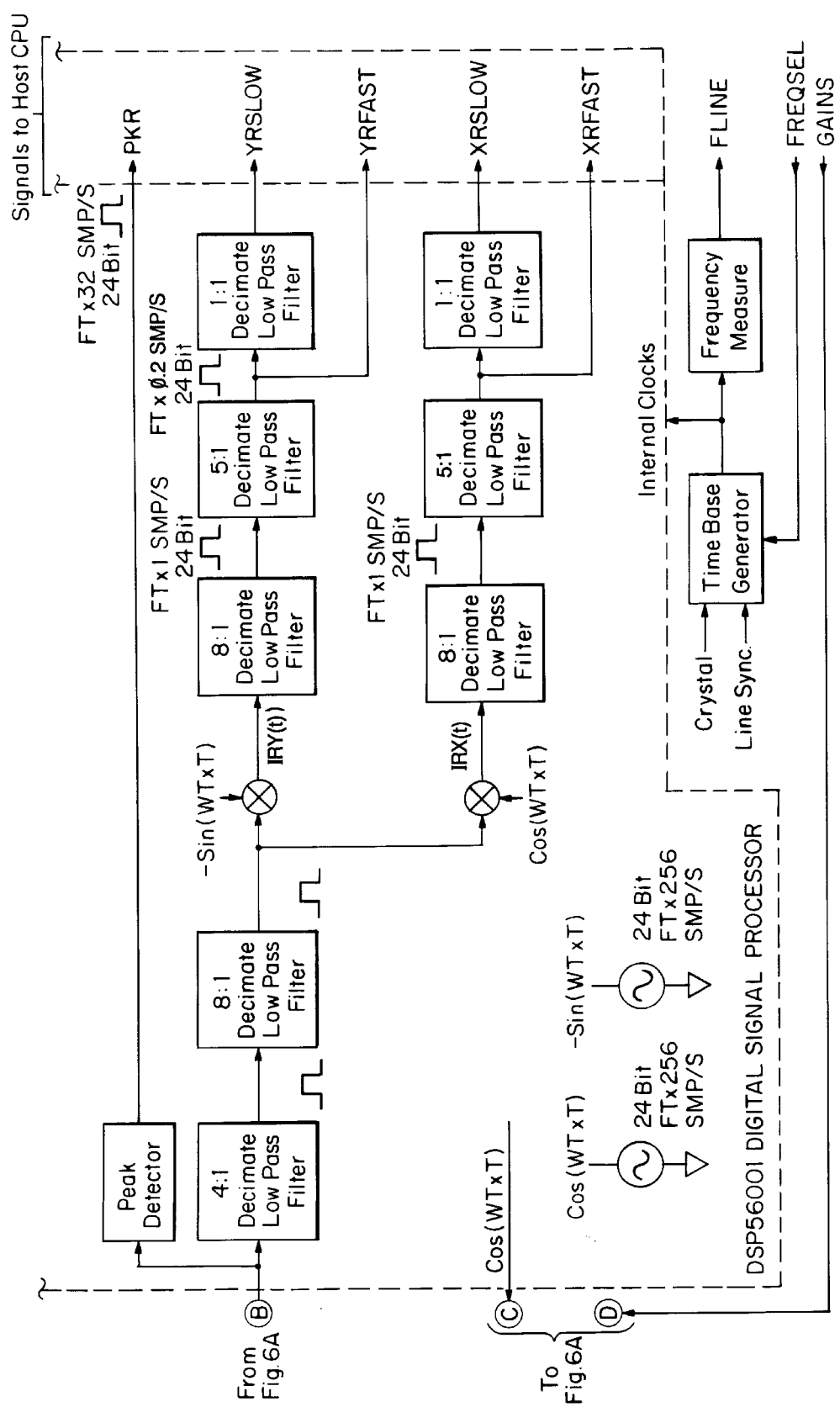

There follows a detailed description of exemplary signal processing calculations according to the invention. These calculations will be better understood by referring to the Test Frequency (WT) Phasor Diagram of FIG. 5, and the signal flow and processing by referring to FIG. 6. An underlined variable indicates a complex quantity. A double underlined variable indicates a phasor quantity. Brackets [ ] indicated a vector magnitude. The variable t indicates time in seconds. Quantities beginning with V indicate Volts, quantities beginning with I indicate Amperes, quantities beginning with Z indicate Ohms, quantities beginning with C indicate Farads, quantities beginning with L indicate Henries, quantities beginning with P indicate radians, and quantities beginning with W indicate radians/second. The symbol j is $(-1)^{0.5}$, or $\sqrt{-1}$. All other quantities are dimensionless unless shown otherwise. The following list describes the variables used in the subsequent calculations. Variables are listed in alphanumeric order.

| Reference | Description |
| --- | --- |
| C | known reference capacitance |
| CAPACITANCE | specimen equivaient parallel capacitance |
| F1, F2, . . . | known 1st stage filter gain at WT, 2*WT, . . . |
| FI1, FI2, . . . | known 1st stage filter gain at WI, 2*WI, . . . |
| FLINE | measured line frequency. |
| II(t) | interference current waveform |
| II1, II2, . . . | interference current 1st harmonic magnitude, 2nd harm . . . |
| INDUCTANCE | specimen equivaient parallel inductance |
| IR(t) | reference current waveform |
| IR1 | reference current phasor |
| IR1, IR2, . . . | reference current 1st harmonic magnitude, 2nd harm . . . |
| IR1(t) | reference current waveform fundamental |
| IRF(t) | 1st stage filtered reference current waveform |
| IRF1 | 1st stage filtered reference current phasor |
| IRF1(t) | 1st stage filtered reference current waveform fundamental |
| IRX(t) | cosine muitiplied filtered reference current waveform |
| IRY(t) | −sine multiplied filtered reference current waveform |
| IS(t) | specimen current waveform |
| IS1 | specimen current phasor |
| IS1, IS2, . . . | specimen current 1st harmonic magnitude, 2nd harm . . . |
| IS1(t) | specimen current waveform fundamental |
| ISF(t) | 1st stage filtered specimen current waveform |

-continued

| Reference | Description |
|---|---|
| ISF1 | 1st stage filtered specimen current phasor |
| ISF1(t) | 1st stage filtered specimen current waveform fundamental |
| ISX(t) | cosine multiplied filtered specimen current waveform |
| ISY(t) | -sine multiplied filtered specimen current waveform |
| IV1 | orthogonal projection of IS1 on IR1 |
| IVF1 | orthogonal projection of ISF1 on IRF1 |
| IW1 | component of IS1 orthogonal to IR1 |
| IWF1 | component of ISF1 orthogonal to IRF1 |
| KA | known test voltage scaling factor |
| KR | known reference current scaling factor |
| KS | known specimen current scaling factor |
| PF1, PF2, ... | known 1st stage filter phase shift at WT, 2*WT, ... |
| PFI1, PFI2, ... | 1st stage filter phase shift at WI, 2*WI, ... |
| PI1, PI2, ... | interference current 1st harmonic phase shift, 2nd harm ... |
| PKR | reference current scaled peak magnitude |
| PKS | specimen current scaled peak magnitude |
| POWER FACTOR | specimen power factor at WT |
| PR1, PR2, ... | reference current 1st harmonic phase shift, 2nd harm ... |
| PS1, PS2, ... | specimen current 1st harmonic phase shift, 2nd ... |
| PV1, PV2, ... | specimen voltage 1st harmonic phase shift, 2nd harm ... |
| RESISTANCE | specimen equivalent parallel resistance at WT |
| VARS | specimen vars at WT |
| VS(t) | specimen voltage waveform |
| VS1 | specimen voltage phasor |
| VS1, VS2, ... | specimen voltage 1st harmonic magnitude, 2nd harm ... |
| VS1(t) | specimen voltage waveform fundamental |
| VT(t) | test voltage waveform |
| VT1 | test voltage phasor |
| WATTS | specimen Watts at WT |
| WT | test frequency |
| XR | scaled x-coordinate of reference current phasor |
| XS | scaled x-coordinate of specimen current phasor |
| YR | scaled y-coordinate of reference current phasor |
| YS | scaled y-coordinate of specimen current phasor |
| ZR(jw) | reference impedance |
| ZS(jw) | specimen impedance |
| ZS1 | specimen total impedance magnitude at WT |
| ZV1 | specimen reactive component impedance magnitude at WT |
| ZW1 | specimen real component impedance magnitude at WT |

EQUATIONS:

EQ1. $VT(t) = KA*COS(WT*t)$

EQ2. $VS(t) = VS1*COS(WT*t + PV1) + VS2*COS(2*WT*t + PV2) + \ldots$

EQ3. $IR(t) = IR1*COS(WT*t + PR1) + IR2*COS(2*WT*t + PR2) + \ldots$

EQ4. $II(t) = II1*COS(WI*t + PI1) + II2*COS(2*WI*t + PI2) + \ldots$

EQ5. $IS(t) = IS1*COS(WT*t + PS1) + IS2*COS(2*WT*t + PS2) + \ldots +$
$II1*COS(WI*t + PI1) + II2*COS(2*WI*t + PI2) + \ldots$ EQ6. $IRF(t) = KR*(F1*IR1*COS(WT*t + PR1 + PF1) +$
$F2*IR2*COS(2*WT*t + PR2 + PF2) + \ldots )$ EQ7. $ISF(t) = KS*(F1*IS1*COS(WT*t + PS1 + PF2) +$
$F2*IS2*COS(2*WT*t + PS2 + PF2) + \ldots +$
$FI1*II1*COS(WI*t + PI1 + PFI1) +$
$FI2*II2*COS(2*WI*t + PI2 + PFI2) + \ldots )$ EQ8. $IRX(t) = IRF(t)*COS(WT*t)$ EQ9. $ISX(t) = ISF(t)*COS(WT*t)$ EQ10. $IRY(t) = IRF(t)*(-SIN(WT*t))$ EQ11. $ISY(t) = ISF(t)*(-SIN(WT*t))$ EQ12. $IRX(t) = KR*((F1*IR1/2)*(COS(PR1 + PF1) +$
$COS(2*WT*t + PR1 + PF1)) +$
$(F2*IR2/2)*(COS(WT*t + PR2 + PF2) +$
$COS (3*WT*t + PR2 + PF2)) + \ldots )$ EQ13. $ISX(t) = KS*((F1*IS1/2)*(COS(PS1 + PF1) +$
$COS(2*WT*t + PS1 + PF1)) +$
$(F2*IS2/2)*(COS(WT*t + PS2 + PF2) +$
$COS(3*WT*t + PS2 + PF2)) + \ldots +$
$(FI1*II1/2)*(COS((WI - WT)*t + PI1 + PFI1) +$
$COS((WI + WT)*t + PI1 + PFI1)) +$
$(FI2*II2/2)*(COS((2*WI - WT)*t + PI2 + PFI2) +$
$COS((2*WI + WT)*t + PI2 + PFI2)) + \ldots$ EQ14. $IRY(t) = KR*((F1*IR1/2)*(SIN(PR1 + PF1) -$
$SIN(2*WT*t + PR1 + PF1)) +$
$(F2*IR2/2)*(SIN(WT*t + PR2 + PF2) -$
$SIN(3*WT*t + PR2 + PF2)) + \ldots )$ EQ15. $ISY(t) = KS*((F1*IS1/2)*(SIN(PS1 + PF1) -$
$SIN(2*WT*t + PS1 + PF1)) +$
$(F2*IS2/2)*(SIN(WT*t + PS2 + PF2) -$
$SIN(3*WT*t + PS2 + PF2)) + \ldots +$
$(FI1*II1/2)*(SIN((WI - WT)*t + PI.1 + PFI1) -$ -continued

| Reference | Description |
|---|---|
| | $SIN((WI + WT)*t + PI1 + PFI1)) +$ |
| | $(F12*II2/2)*(SIN((2*WI - WT)*t + PI2 + PFI2) -$ |
| | $SIN((2*WI + WT)*t + PI2 + PFI2)) + \ldots$ |
| EQ16. | $XR = (KR*F1*IR1/2)*COS(PR1 + PF1)$ |
| EQ17. | $XS = (KS*F1*IS1/2)*COS(PS1 + PF1)$ |
| EQ18. | $YR = (KR*F1*IR1/2)*SIN(PR1 + PF1)$ |
| EQ19. | $YS = (KS*F1*IS1/2)*SIN(PS1 + PF1)$ |
| EQ20. | $IRF^2(t) = IRF(t)*IRF(t)$ |
| EQ21. | $ISF^2(t) = ISF(t)*ISF(t)$ |
| EQ22. | $IRF^2(t) = (KR^2/2)*((F1*IR1)^2 +$ |
| | $(F1*IR1)^2*COS(2*(WT*t + PR1 + PF1)) + \ldots +$ |
| | $(F2*IR2)^2 +$ |
| | $(F2*IR2)^2*COS(2*(WT*t + PR2 + PF2)) + \ldots + \ldots)$ |
| EQ23. | $ISF^2(t) = (KS^2/2)*((F1*IS1)^2 +$ |
| | $(F1*IS1)^2*COS(2*(WT*t + PS1 + PF1)) + \ldots +$ |
| | $(F2*IS2)^2 +$ |
| | $(F2*IS2)^2*COS(2*(WT*t + PS2 + PF2)) + \ldots +$ |
| | $(FI1*II1)^2 +$ |
| | $(FI1*II1)^2*COS(2*(WI*t + PI1 + PFI1)) + \ldots +$ |
| | $(F12*II2)^2 +$ |
| | $(FI2*II2)^2*COS(2*(WI*t + PI2 + PFI2)) + \ldots)$ |
| EQ24. | $IR1(t) = IR1*COS(WT*t + PR1)$ |
| EQ25. | $IS1(t) = IS1*COS(WT*t + PS1)$ |
| EQ26. | $VS1(t) = VS1*COS(WT*t + PV1)$ |
| EQ27. | $VT1(t) = KA*COS(WT*t)$ |
| EQ28. | $IR1(t) = Real\ (\overline{IR1}*e\hat{\ }(j*WT*t))$ |
| EQ29. | $IS1(t) = Real\ (\overline{IS1}*e\hat{\ }(j*WT*t))$ |
| EQ30. | $VS1(t) = Real\ (\overline{VS1}*e\hat{\ }(j*WT*t))$ |
| EQ31. | $VT1(t) = Real\ (\overline{VT1}*e\hat{\ }(j*WT*t))$ |
| EQ32. | $\overline{IR1} = IR1*e\hat{\ }(j*\overline{PR1})$ |
| EQ33. | $\overline{IS1} = IS1*e\hat{\ }(j*PS1)$ |
| EQ34. | $\overline{VS1} = VS1*e\hat{\ }(j*PV1)$ |
| EQ35. | $\overline{VT1} = KA$ |
| EQ36. | $\overline{IRF1}(t) = (KR\&F1*IR1/2)*COS(WT*t + PR1 + PF1)$ |
| EQ37. | $ISF1(t) = (KS*F1*IS1/2)*COS(WT*t + PS1 + PF1)$ |
| EQ38. | $IRF1(t) = Real\ (\overline{IRF1}*e\hat{\ }(j*WT*t))$ |
| EQ39. | $ISF1(t) = Real\ (\overline{ISF1}*e\hat{\ }(j*WT*t))$ |
| EQ40. | $\overline{IRF1} = (KR*F1*\overline{IR1}/2)*e\hat{\ }(j*(PR1 + PF1))$ |
| EQ41. | $\overline{ISF1} = (KS*F1*IR1/2)*e\hat{\ }(j*(PS1 + PF1))$ |
| EQ42. | $[\overline{IR1}] = (2/KR*F1)*[\overline{IRF1}] = (2/KR*F1)*((XR^2 + YR^2)^.5)$ |
| EQ43. | $[\overline{IS1}] = (2/KS*F1)*[\overline{ISF1}] = (2/KS*F1)*((XS^2 + YS^2)^.5)$ |
| EQ44. | $[\overline{IVF1}] = (XS*YR + \overline{YS*YR})/[\overline{IRF1}]$ |
| EQ45. | $[\overline{IWF1}] = (XS*YR - XR*YS)/[\overline{IRF1}]$ |
| EQ46. | $[\overline{IV1}] = (2/KS*F1)*[\overline{IVF1}]$ |
| EQ47. | $[\overline{IW1}] = (2/KS*F1)*[\overline{IWF1}]$ |
| EQ48. | $[\overline{IV1}] = (2/KS*F1)*((\overline{XS*XR} + YS*YR)/((XR^2 + YR^2)^.5))$ |
| EQ49. | $[\overline{IW1}] = (2/KS*F1)*((XS*YR - XR*YS)/((XR^2 + YR^2)^.5))$ |
| EQ50. | $[\overline{VS1}] = [\overline{IR1}]*[\overline{ZR}] = [\overline{IR1}]*(1/C*WT)$ |
| EQ51. | $[\overline{VS1}] = (2/\overline{KR*F1*C*WT})*((XR^2 + YR^2)^.5)$ |
| EQ52. | $[\overline{ZS1}] = [\overline{VS1}]/[\overline{IS1}]$ |
| EQ53. | $[\overline{ZW1}] = [\overline{VS1}]/[\overline{IW1}]$ |
| EQ54. | $[\overline{ZV1}] = -[\overline{VS1}]/[\overline{IV1}]$ |
| EQ55. | $[\overline{ZW1}] = (\overline{KS/KR*WT}*C)*((XR^2 + YR^2)/(XS*YR - XR*YS))$ |
| EQ56. | $[\overline{ZV1}] = -(KS/KR*WT*C)*((XR^2 + YR^2)/(XS*XR + YS*YR))$ |
| EQ57. | $[\overline{VS1}]rms = (2^.5/KR*F1*C*WT)*((XR^2 + YR^2)^.5)$ |
| EQ58. | $[\overline{IS1}]rms = (2^.5/KS*F1)*((XS^2 + YS^2)^.5)$ |
| EQ59. | $WATTS = [\overline{IW1}]rms*[\overline{VS1}]rms$ |
| EQ60. | $WATTS = (2/KR*KS*F1^2*WT*C)*(XS*YR - XR*YS)$ |
| EQ61. | $VARS = -[\overline{IV1}]rms*[\overline{VS1}]rms$ |
| EQ62. | $VARS = -(2/KR*KS*F1^2*WT*C)*(XS*XR + YS*YR)$ |
| EQ63. | $PARALLEL\ CAPACITANCE = 1/[\overline{ZV1}]*WT =$ |
| | $(KR*C/KS)*((XS*XR + YS*YR)/(XR^2 + YR^2))$ |
| EQ64. | $SERIES\ CAPACITANCE = (KR*C/KS)*((XS^2 + YS^2)/(XS*XR + YS*YR))$ |
| EQ65. | $PARALLEL\ INDUCTANCE = -[\overline{ZV1}]/WT =$ |
| | $-(KS/KR*C*WT^2)*((XR^2 + YR^2)/(XS*XR + YS*YR))$ |
| EQ66. | $SERIES\ INDUCTANCE = -(KS/KR*C*WT^2)*((XS*XR + YS*YR)/(XS^2 + YS^2))$ |
| EQ67. | $PARALLEL\ RESISTANCE = [\overline{ZW1}] =$ |
| | $(KS/KR*WT*C)*((XR^2*YR^2)/(XS*YR - XR*YS))$ |
| EQ68. | $SERIES\ RESISTANCE = (KS/KR*WT*C)*((XS*YR - XR*YS)/(XS^2 + YS^2))$ |
| EQ69. | $POWER\ FACTOR = (XS*YR - XR*YS)/((XR^2 + YR^2)^.5*(XS^2 + YS^2)^.5)$ |

Other embodiments are within the claims.

What is claimed is:

1. Apparatus for measuring impedance of a power system test specimen adapted for operation at a predetermined line frequency, comprising:

a power amplifier for providing first and second test signals each of frequency different from the predetermined line frequency;

a frequency controller for setting the frequency of said first and second test signals to desired first and second test frequencies respectively different from and centered about said predetermined line frequency;

a coupler for coupling said first and second test signals to said power system to provide first and second impedance signals representative of the impedance of said power system test specimen at the first and second frequencies of said first and second test signals respectively, an impedance measurer for coupling to said power system test specimen and responsive to said first and second impedance signals for providing first and second impedance measurement signals respectively representative of impedance of said power system test specimen at said first and second frequencies different from said predetermined line frequency by an increment significantly less than said predetermined line frequency, and a processor for processing said first and second impedance measurement signals to provide a line impedance signal representative of the power system test specimen impedance at said predetermined line frequency, said processor constructed and arranged to process by digital filtering algorithm to reject power line frequency interference when processing said first and second impedance measurement signals.

2. Apparatus in accordance with claim 1 wherein said power amplifier provides at least first and second test signals of test frequencies respectively below and above the predetermined line frequency, and said impedance measurer provides at least first and second impedance measurement signals representative of impedance of said power system at said first and second test frequencies, respectively, and said processor processes said impedance measurement signals to provide said line impedance signal representative of the power system impedance at said predetermined line frequency.

3. Apparatus in accordance with claim 1 wherein said test frequencies are within the frequency range between about 45 Hz and about 66 Hz.

4. Apparatus in accordance with claim 2 wherein said test frequencies are within the frequency range between about 45 Hz and about 66 Hz.

5. Apparatus in accordance with claim 3 wherein said increment is about 5% of said line frequency.

6. Apparatus in accordance with claim 4 wherein said increment is about 5% of said line frequencies.

7. A method of measuring impedance of a power system test specimen adapted for operation at a predetermined line frequency which method includes the steps of, applying at least first and second test signals to said power system test specimen at least first and second test frequencies respectively each different from and centered about said line frequency by an increment significantly less than said predetermined line frequency to provide at least first and second impedance signals respectively representative of the impedance of said power system test specimen at at least said first and second test frequencies respectively, measuring the first and second impedance signals to provide at least first and second impedance measurement signals at said first and second test frequencies respectively, and processing said at least first and second impedance measurement signals to provide a line impedance signal representative of the impedance of said power system test specimen at said line frequency, including processing by digital filtering algorithms to reject power line frequency interference.

8. A method in accordance with claim 7 and further including providing at least first and second test signals of first and second test frequencies respectively below and above the predetermined line frequency, and providing at least first and second impedance measurement signals representative of impedance of said power system at said first and second test frequencies respectively, and processing said impedance measurement signals to provide said line impedance signal representative of the power system impedance at said predetermined line frequency.

9. A method in accordance with claim 7 wherein said test frequencies are within the frequency range between about 45 Hz and about 66 Hz.

10. A method in accordance with claim 8 wherein said test frequencies are within the frequency range between about 45 Hz and about 66 Hz.

11. A method in accordance with claim 7 wherein said increment is about 5% of said line frequency.

12. A method in accordance with claim 8 wherein said increment is about 5% of said line frequency.

13. Apparatus in accordance with claim 1 wherein said impedance signals are signals at said test frequencies representative of the current through said test impedance at said test frequencies and the power losses in said test impedance at said test frequencies.

14. A method in accordance with claim 7 wherein said impedance measurement signals are signals at said test frequencies representative of the current through said test impedance at said test frequencies and the power losses in said test impedance at said test frequencies.

* * * * *